(12) United States Patent  
Park et al.

(10) Patent No.: US 8,717,724 B2  
(45) Date of Patent: May 6, 2014

(54) DIODE FOR ELECTROSTATIC PROTECTION

(75) Inventors: Joon Young Park, Bucheon-si (KR); Jong Hoon Park, Incheon (KR); Chang Kun Park, Suwon-si (KR)

(73) Assignee: Soongsil University research Consortium techno-Park, Seoul (KR)

( * ) Notice: Subject to any disclaimer, the term of this patent is extended or adjusted under 35 U.S.C. 154(b) by 0 days.

(21) Appl. No.: 13/881,227

(22) PCT Filed: Oct. 13, 2011

(86) PCT No.: PCT/KR2011/007598  
§ 371 (c)(1),  
(2), (4) Date: Apr. 24, 2013

(87) PCT Pub. No.: WO2012/057464  
PCT Pub. Date: May 3, 2012

(65) Prior Publication Data  
US 2013/0207224 A1    Aug. 15, 2013

(30) Foreign Application Priority Data  
Oct. 28, 2010   (KR) .................. 10-2010-0106350

(51) Int. Cl.  
*H02H 9/00* (2006.01)  
*H02H 3/22* (2006.01)  
*H01L 29/73* (2006.01)  
*H01L 27/02* (2006.01)

(52) U.S. Cl.  
CPC ................... *H01L 27/0248* (2013.01)  
USPC ............. 361/56; 361/111; 327/321; 327/325; 257/173; 257/199; 257/355; 257/360; 257/361; 257/487; 257/E23.141; 257/E29.181; 257/E29.211; 257/E29.225; 438/237; 438/361

(58) Field of Classification Search  
CPC .................................................... H01L 27/0248  
USPC ............. 361/56, 111; 327/321, 325; 438/237, 438/361; 257/173, 199, 355, 360, 361, 487, 257/E23.141, E29.181, E29.211, E29.225  
See application file for complete search history.

(56) References Cited

U.S. PATENT DOCUMENTS 5,959,820 A * 9/1999 Ker et al. ................... 361/111  
7,280,329 B2 * 10/2007 Kim et al. .................. 361/56  
(Continued)

FOREIGN PATENT DOCUMENTS

JP   08-088326 A    4/1996  
JP   2005-310993 A  11/2005  
(Continued)

*Primary Examiner* — Dao H Nguyen  
(74) *Attorney, Agent, or Firm* — Sherr & Jiang, PLLC

(57) ABSTRACT

Provided is an electrostatic discharge (ESD) protection diode that is formed on an input/output pad of an integrated circuit (IC), the ESD protection diode including: an N-type semiconductor that constitutes a first diode and is connected to a pad for a power supply voltage; a P-type semiconductor that constitutes the first diode and is connected to a signal line; an N-type semiconductor that constitutes a second diode and is connected to the signal line; a P-type semiconductor that constitutes the second diode and is connected to a pad for grounding; and a third diode that is formed by contacting the N-type semiconductor of the first diode and the P-type semiconductor of the second diode.

1 Claim, 5 Drawing Sheets

(56) References Cited

U.S. PATENT DOCUMENTS

| | | |
|---|---|---|
| 7,339,771 B2 | 3/2008 | Morishita |
| 7,570,467 B2 | 8/2009 | Watanabe et al. |
| 7,755,870 B2 * | 7/2010 | Arai et al. ............ 361/56 |
| 7,796,367 B2 * | 9/2010 | Moon ................. 361/56 |
| 2004/0105203 A1 * | 6/2004 | Ker et al. ............ 361/56 |
| 2005/0231867 A1 | 10/2005 | Morishita |
| 2006/0109595 A1 | 5/2006 | Watanabe et al. |
| 2008/0123230 A1 | 5/2008 | Yun |
| 2011/0284925 A1 * | 11/2011 | Gauthier et al. ........ 257/173 |
| 2011/0303947 A1 * | 12/2011 | Salcedo et al. ........ 257/173 |

FOREIGN PATENT DOCUMENTS

| | | |
|---|---|---|
| JP | 2006-100532 A | 4/2006 |
| KR | 10-0631961 B1 | 10/2006 |
| KR | 10-2008-0003045 A | 1/2008 |
| KR | 10-2010-0052297 A | 5/2010 |

\* cited by examiner

DIODE FOR ELECTROSTATIC PROTECTION

CROSS REFERENCE TO PRIOR APPLICATION

This application is a National Stage Patent Application of PCT International Patent Application No. PCT/KR2011/007598 (filed on Oct. 13, 2011) under 35 U.S.C. §371, which claims priority to Korean Patent Application No. 10-2010-0106350 (filed on Oct. 28, 2010), which are all hereby incorporated by reference in their entirety.

TECHNICAL FIELD

The present invention relates to an electrostatic discharge (ESD) protection diode, and more particularly, to an ESD protection diode that is formed on an input/output pad of an integrated circuit (IC) so that static electricity can be prevented from flowing into an internal circuit.

BACKGROUND ART

FIG. 1 illustrates an example of an electrostatic discharge (ESD) protection circuit according to the related art.

In FIG. 1, reference numeral 101 represents a diode for ESD protection, reference numeral 102 represents an input pad of an integrated circuit (IC), and reference numeral 103 represents an output pad of the integrated circuit (IC). Also, reference numeral 104 represents a line connected to a pad for a power supply voltage that supplies a power supply voltage to a circuit, and reference numeral 105 represents a line connected to a pad for grounding the circuit.

Reference numeral 106 represents a circuit that allows a current of static electricity generated in the input pad 102 to flow out through the power supply voltage line 104 or the ground line 105, and reference numeral 107 represents a circuit that allows the current of static electricity generated in the output pad 103 to flow out through the power supply voltage line 104 or the ground line 105.

Reference numeral 108 represents a power clamp circuit that allows the current of static electricity to flow between the power supply voltage line 104 and the ground line 105. Reference numeral 109 represents an internal circuit having low endurance from static electricity. A circuit consisting of ESD protection elements including a diode so as to protect the internal circuit having low endurance from static electricity, as illustrated in FIG. 1, is referred to as an ESD protection network.

FIG. 2 illustrates an example in which the ESD protection network of FIG. 1 operates. In FIG. 2, the flow of the current of static electricity when static electricity is generated in the input pad 102 and flows out to the output pad 103, is indicated by reference numeral 201. In this case, static electricity generated in the input pad 102 flows in the power clamp circuit 108 through the power supply voltage line 104 via the circuit 106, and the current of static electricity flows out to the output pad 103 via the circuit 107. As illustrated in FIG. 2, the current of static electricity bypasses the internal circuit with low endurance from static electricity so as to safely flow out to the output pad 103.

FIG. 3 illustrates another example of an operation of the ESD protection network of FIG. 1. In FIG. 3, the flow of the current of static electricity when static electricity is generated in a pad for grounding 301 and flows out to a pad for a power supply voltage 302, is indicated by reference numeral 303. As in reference numeral 303, the current of static electricity starts from the pad for grounding 301 and flows out to the pad for the power supply voltage 302 via the circuit 107. Even in this case, as illustrated in FIG. 2, the ESD network operates in such a way that the current of static electricity bypasses the internal circuit with low endurance from static electricity.

If static electricity generated in the pad for grounding 301 flows out to the pad for the power supply voltage 302, as illustrated in FIG. 3, the current of static electricity should pass through two diodes of the ESD protection circuit 107. In general, when the current of static electricity passes through the ESD protection element, such as a diode, power consumption occurs due to parasitic resistances of the ESD protection element. Power consumed in this way is transformed to heat. If transformed heat rises to a higher temperature than a melting point of the ESD protection element, the ESD protection element is destroyed, and the whole ESD protection circuit 107 is destroyed by static electricity and as such, a desired function cannot be performed any more. Thus, it is significant to configure the ESD protection network to pass through a minimum ESD protection element until the current of static electricity flows out from the circuit.

FIG. 4 illustrates an example in which an ESD protection network is configured in such a way that, when the current of static electricity is generated, as illustrated in FIG. 3, the current of static electricity can pass through one ESD protection element. In FIG. 4, a P-type semiconductor of a diode 401 is connected to the ground line 105, and an N-type semiconductor of the diode is connected to the power supply voltage line 104. In this case, like in FIG. 3, when static electricity generated in the pad for grounding 301 should flow out to the pad for the power supply voltage 302, unlike in FIG. 3, the current of static electricity flows through the diode 401. That is, the number of diodes through which the current of static electricity passes through, of FIG. 4 is reduced by one compared to FIG. 3.

Thus, when the same current of static electricity is applied to the circuits of FIGS. 3 and 4, in FIG. 3, the current of static electricity should pass through two diodes, and in FIG. 4, the current of static electricity should pass through one diode. Thus, ideally, in FIG. 4, parasitic resistances caused by the diode are reduced by half compared to FIG. 3. Thus, when the same current of static electricity flows through the circuits of FIGS. 3 and 4, in FIG. 4, power consumption caused by the current of static electricity is reduced by half compared to FIG. 3. Thus, the increase in a temperature of the circuit of FIG. 4 is reduced compared to FIG. 3. As a result, the ESD protection network of FIG. 4 has a higher endurance from static electricity than the ESD protection network of FIG. 3.

FIGS. 5A and 5B illustrate an ESD protection diode according to the related art. FIG. 5A shows the layout of the ESD protection diode according to the related art, and FIG. 5B shows a symbol thereof.

As illustrated in FIG. 5A, the ESD protection diode is configured as a combination of an N-type semiconductor 501 and a P-type semiconductor 502. In actuality, the N-type semiconductor 501 and the P-type semiconductor 502 have uniform resistances, and additionally, parasitic resistances exist in a junction of the N-type semiconductor 501 and the P-type semiconductor 502. If the current of static electricity passes through the ESD protection diode, due to the parasitic resistances in the diode, voltage drop occurs in both ends of the ESD protection diode. Due to the voltage drop and the current of static electricity, power of the ESD protection diode is consumed, and the temperature of the PN junction rises.

Although the ESD protection network of FIG. 4 has a higher endurance from static electricity than the ESD protection network of FIG. 3, the ESD protection network of FIG. 3 is generally preferable. This is because the diode 401 should be additionally connected to the ESD protection network of FIG. 3 so as to configure the ESD protection network of FIG. 4.

In a present integrated circuit (IC), the size of a circuit directly relates to production cost. The use of an additional element in the circuit causes an increase in the size of the circuit, which causes an increase in production cost. Thus, although the ESD protection network of FIG. 4 has a higher endurance from static electricity than the ESD protection network of FIG. 3, production cost for the circuit may increase compared to FIG. 3.

DETAILED DESCRIPTION OF THE INVENTION

Technical Problem

The present invention provides an electrostatic discharge (ESD) protection diode, whereby, when the ESD protection diode is formed on an input/output pad of an integrated circuit (IC), as a third diode is formed by contacting an N-type semiconductor of a first diode and a P-type semiconductor of a second diode, the first diode and the second diode can prevent static electricity generated in the input/output pad of the integrated circuit (IC) from flowing into an internal circuit and when static electricity generated in a ground pad flows out to a pad for a power supply voltage, the third diode is electrically conductive so that static electricity can be prevented from flowing into the internal circuit.

Technical Solution

According to an aspect of the present invention, there is provided an electrostatic discharge (ESD) protection diode including: an N-type semiconductor that constitutes a first diode and is connected to a pad for a power supply voltage; a P-type semiconductor that constitutes the first diode and is connected to a signal line; an N-type semiconductor that constitutes a second diode and is connected to the signal line; a P-type semiconductor that constitutes the second diode and is connected to a pad for grounding; and a third diode that is formed by contacting the N-type semiconductor of the first diode and the P-type semiconductor of the second diode.

Effect of the Invention

In an electrostatic discharge (ESD) protection diode according to the present invention, as a third diode is formed by contacting an N-type semiconductor of a first diode and a P-type semiconductor of a second diode, the first diode and the second diode can prevent static electricity generated in the input/output pad of the integrated circuit (IC) from flowing into an internal circuit, and when static electricity generated in a ground pad flows out to a pad for a power supply voltage, the third diode is electrically conductive so that static electricity can be prevented from flowing into the internal circuit.

Thus, although no additional diode is used, an additional diode is formed between a line for grounding and a line for the power supply voltage so that endurance from static electricity can be improved without increasing the area of a circuit.

BEST MODE OF THE INVENTION

The present invention will now be described more fully with reference to the accompanying drawings, in which exemplary embodiments of the invention are shown, so that one of ordinary skill in the art can easily embody the invention.

Figure 1:
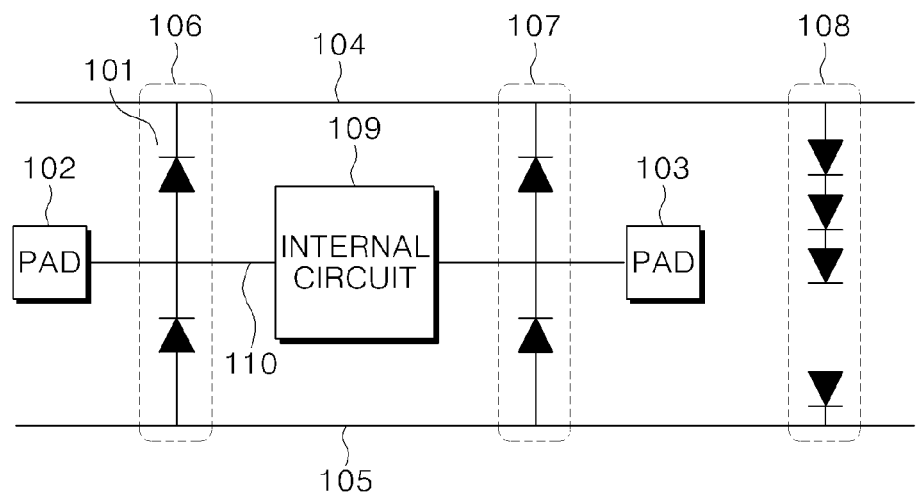
FIG. 1 is a view of an electrostatic discharge (ESD) protection network configured on an integrated circuit (IC) using an ESD protection diode according to the related art.
Figure 2:
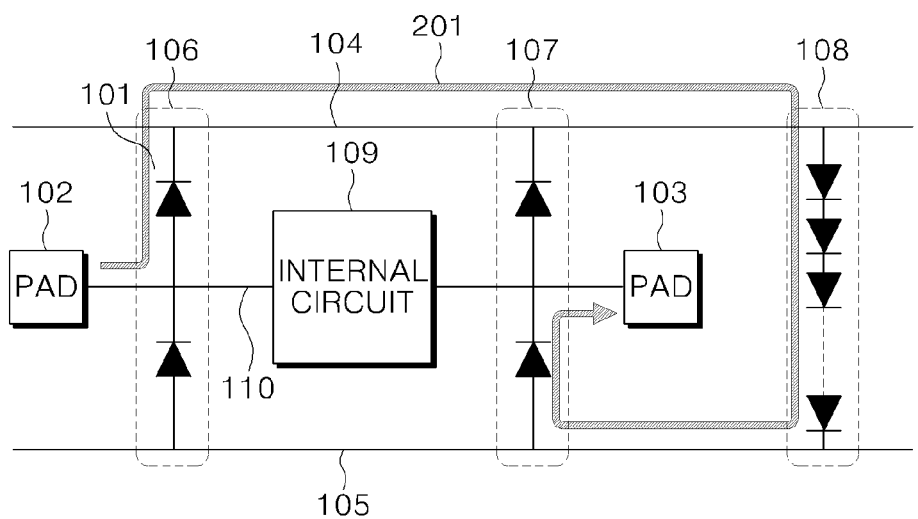
FIG. 2 illustrates an example of a path on which a current of static electricity flows, when static electricity occurs in the ESD protection network according to the related art.
Figure 3:
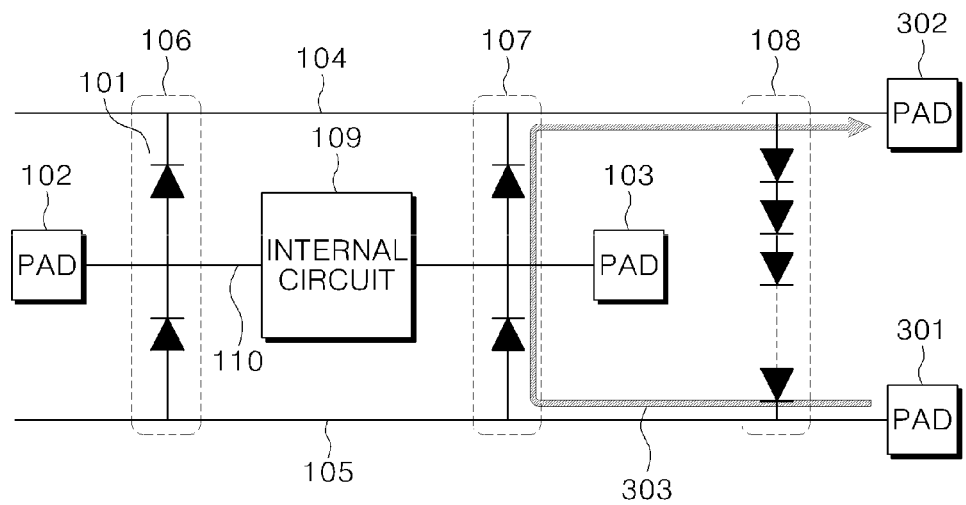
FIG. 3 illustrates another example of a path on which the current of static electricity flows, when static electricity occurs in the ESD protection network according to the related art.
Figure 6:
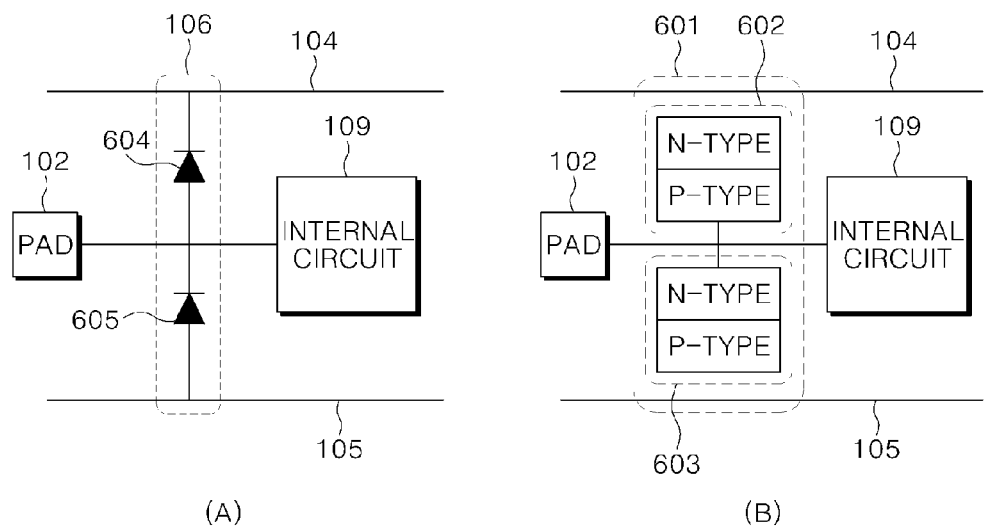
FIG. 6A is a view of portions of the ESD protection network illustrated in FIG. 1.
FIG. 6B is a view of a diode used in FIG. 6A as a P-type semiconductor and an N-type semiconductor.

FIG. 6A is a view of portions of FIG. 1 that is re-drawn for conveniences of explanation. FIG. 6B illustrates 106 of FIG. 6A as the shape of a diode configured as a combination of an N-type semiconductor and a P-type semiconductor, as indicated by reference numeral 601. Reference numeral 602 is expression of a diode symbol 604 of FIG. 6A as a combination of the N-type semiconductor and the P-type semiconductor. Reference numeral 603 is expression of a diode symbol 605 of FIG. 6A as a combination of the N-type semiconductor and the P-type semiconductor.

Figure 7:
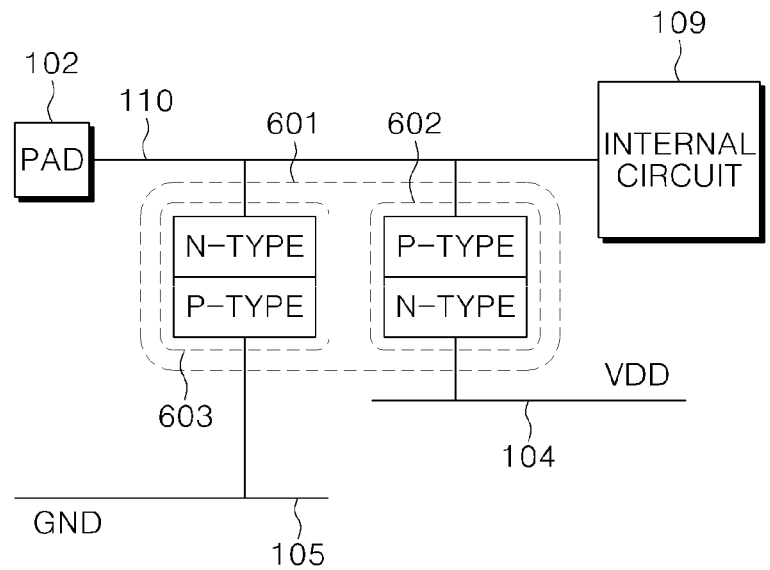
FIG. 7 is a view of FIG. 6B that is re-drawn for conveniences of explanation.

Also, FIG. 7 is a view of a line for a power supply voltage 104 of FIG. 6B only by changing its position. FIG. 7 is a view of FIG. 6B that is re-drawn for conveniences so as to explain an electrostatic discharge (ESD) protection diode according to the present invention and is the same circuit diagram as FIG. 6B.

Figure 8:
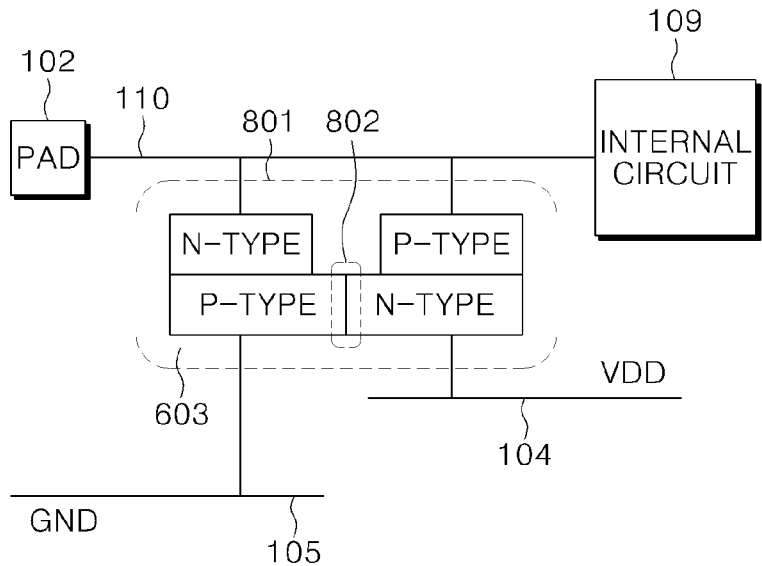
FIG. 8 illustrates an example in which an ESD protection diode according to the present invention is applied to a circuit.

FIG. 8 illustrates an example in which the ESD protection diode according to the present invention is used. Reference numeral 801 of FIG. 8 represents the ESD protection diode according to the present invention. A P-type semiconductor of a diode (see 603 of FIG. 7) and an N-type semiconductor of a diode (see 602 of FIG. 7) contact each other, thereby forming the ESD protection diode according to the present invention (see 801 of FIG. 8). A portion formed by contacting the P-type semiconductor of the diode (see 603 of FIG. 7) and the N-type semiconductor of the diode (see 602 of FIG. 7) is indicated by 802 of FIG. 8. Thus, 801 of FIG. 8 represents a total of three diodes using two N-type semiconductors and two P-type semiconductors.

That is, an N-type semiconductor that constitutes a first diode is connected to the power supply voltage line 104, and a P-type semiconductor that constitutes the first diode is connected to a signal line 110. An N-type semiconductor that constitutes a second diode is connected to the signal line 110, and a P-type semiconductor that constitutes the second diode is connected to a ground line 105. Simultaneously, the N-type semiconductor of the first diode and the P-type semiconductor of the second diode contact each other, as indicated by 802, so as to form a third diode.

Figure 9:
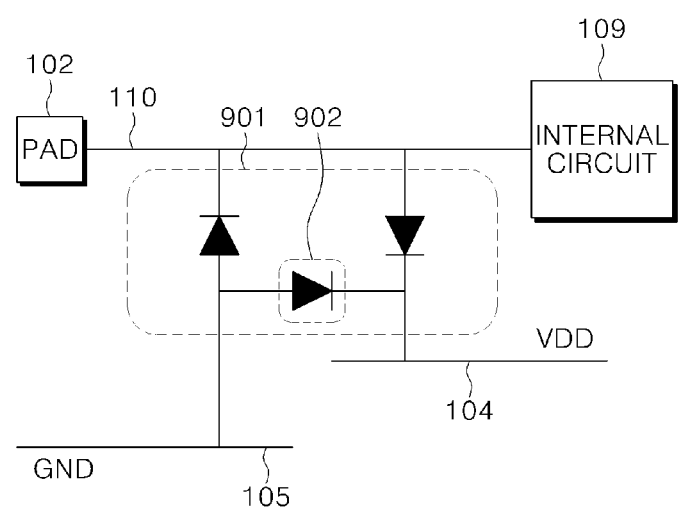
FIG. 9 is a circuit diagram of the ESD protection diode illustrated in FIG. 8 using a diode symbol.

FIG. 9 illustrates three PN junctions formed in 801 of FIG. 8 as a diode symbol. Thus, 901 of FIG. 9 is an equivalent circuit of 801 of FIG. 8. As apparent from 901, an additional diode 902 is formed between the power supply voltage line 104 and the ground line 105, which does not exist in FIG. 6A.

Figure 4:
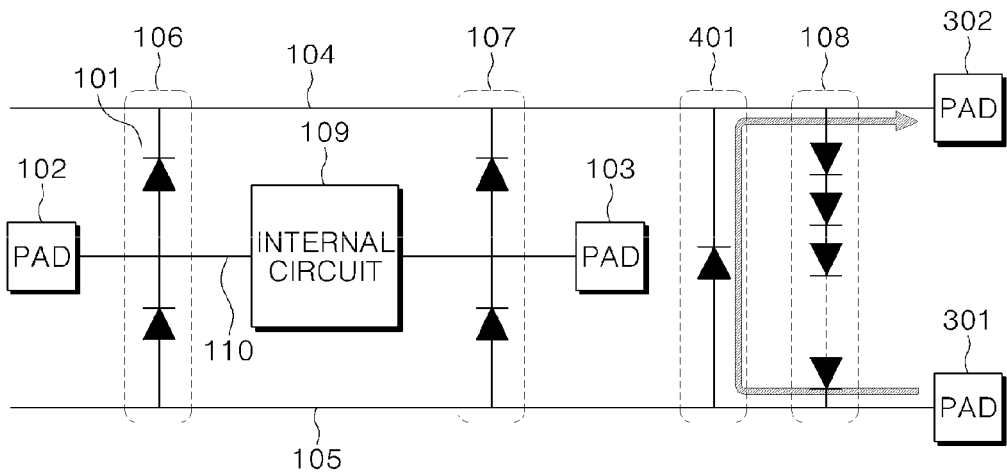
FIG. 4 illustrates an example of a path on which the current of static electricity flows, when one ESD protection diode is added to the configuration of FIG. 3 and static electricity occurs in the ESD protection network according to the related art.
Figure 5:
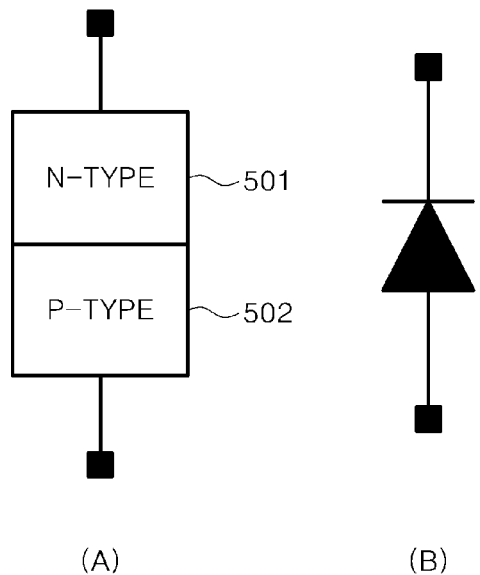
FIG. 5A is a view of an ESD protection diode including an N-type semiconductor and a P-type semiconductor.
FIG. 5B illustrates a symbol of FIG. 5A.

Thus, when the ESD protection diode 801 according to the present invention is used, a diode (see 401 of FIG. 4) can be obtained without using an additional diode. In other words, although no additional diode is used, an additional diode is formed between a ground line and a power supply voltage line so that endurance from static electricity can be improved without increasing the area of a circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An electrostatic discharge (ESD) protection diode comprising:
    an N-type semiconductor that constitutes a first diode and is connected to a pad for a power supply voltage;
    a P-type semiconductor that constitutes the first diode and is connected to a signal line;
    an N-type semiconductor that constitutes a second diode and is connected to the signal line;
    a P-type semiconductor that constitutes the second diode and is connected to a pad for grounding; and
    a third diode that is formed by contacting the N-type semiconductor of the first diode and the P-type semiconductor of the second diode.

\* \* \* \* \*